United States Patent
Beukema et al.

(10) Patent No.: US 8,964,825 B2
(45) Date of Patent: Feb. 24, 2015

(54) ANALOG SIGNAL CURRENT INTEGRATORS WITH TUNABLE PEAKING FUNCTION

(75) Inventors: Troy J. Beukema, Briarcliff Manor, NY (US); John F. Bulzacchelli, Yonkers, NY (US)

(73) Assignee: International Business Machines Corporation, Armonk, NY (US)

( * ) Notice: Subject to any disclaimer, the term of this patent is extended or adjusted under 35 U.S.C. 154(b) by 471 days.

(21) Appl. No.: 13/399,675

(22) Filed: Feb. 17, 2012

(65) Prior Publication Data

US 2013/0215954 A1 Aug. 22, 2013

(51) Int. Cl.
*H03H 7/30* (2006.01)
*H04B 1/10* (2006.01)

(52) U.S. Cl.
USPC ........................................... 375/232; 375/350

(58) Field of Classification Search
USPC .................. 375/232–236, 257, 350
See application file for complete search history.

(56) References Cited

U.S. PATENT DOCUMENTS

| | | | |
|---|---|---|---|
| 5,377,272 A | 12/1994 | Albean | |
| 8,031,763 B2 * | 10/2011 | Sumesaglam | 375/232 |
| 8,085,841 B2 | 12/2011 | Bulzacchelli et al. | |
| 2001/0053174 A1 | 12/2001 | Fleming et al. | |
| 2006/0182171 A1* | 8/2006 | Kuijk et al. | 375/229 |
| 2007/0057722 A1* | 3/2007 | Kwon et al. | 330/53 |
| 2010/0046683 A1* | 2/2010 | Beukema et al. | 375/355 |
| 2012/0176667 A1* | 7/2012 | He et al. | 359/344 |

FOREIGN PATENT DOCUMENTS

CN 101271142 A 9/2008

* cited by examiner

*Primary Examiner* — Don N Vo
(74) *Attorney, Agent, or Firm* — Anne V. Dougherty; Ryan, Mason & Lewis, LLP

(57) ABSTRACT

Analog signal current integrators are provided having tunable peaking functions. Analog signal current integrators with tunable peaking functions enable data rate dependent loss compensation for applications in high data rate receiver integrated circuits incorporating advanced equalization functions, such as decision-feedback equalizers. For instance, a current integrator circuit includes a current integrating amplifier circuit comprising an adjustable circuit element to tune a peaking response of the current integrator circuit, and a peaking control circuit to generate a control signal to adjust a value of the adjustable circuit element as a function of an operating condition of the current integrator circuit. The operating condition may be a specified data rate or a communication channel characteristic or both. The adjustable circuit element may be a degeneration capacitor or a bias current source.

20 Claims, 5 Drawing Sheets

30

ANALOG SIGNAL CURRENT INTEGRATORS WITH TUNABLE PEAKING FUNCTION

TECHNICAL FIELD

The field generally relates to circuits and methods for implementing analog signal current integrators with tunable peaking functions and, in particular, analog signal current integrators with tunable peaking functions to enable data rate dependant loss compensation for applications in high data rate receiver integrated circuits incorporating advanced equalization functions, such as decision-feedback equalizers.

BACKGROUND

In general, data receivers implement processing functions to convert a received analog signal to digital values that represent estimates of transmitted data. In state of the art high-rate data receivers, in particular serial line receivers, these processing functions are often realized through a combination of analog signal processing functions, which typically include a line equalization function, followed by a data slicer block that converts the equalized analog signal to binary data. By way of specific example, serial data receivers can implement DFE (decision feedback equalization) functions using either non-integrating DFE summer circuits or sampled current integrator DFE summer circuits, as is well known in the art. However, non-integrating DFE summer circuits are not power efficient for DFE summation functions in high data rate receivers and sampled current integration DFE summer circuits do not provide optimum noise suppression in high data rate receivers.

SUMMARY

Exemplary embodiments of the invention generally include circuits and methods for implementing analog signal current integrators with tunable peaking functions and, in particular, analog signal current integrators with tunable peaking functions to enable data rate dependant loss compensation for applications in high data rate receiver integrated circuits incorporating advanced equalization functions, such as decision-feedback equalizers.

In one exemplary embodiment of the invention, a current integrator circuit includes a current integrating amplifier circuit comprising an adjustable circuit element to tune a peaking response of the current integrator circuit, and a peaking control circuit to generate a control signal to adjust a value of the adjustable circuit element as a function of an operating condition of the current integrator circuit. The operating condition may be a specified data rate or a communication channel characteristic or both. The adjustable circuit element may be a degeneration capacitor or a bias current source.

In another exemplary embodiment of the invention, a data receiver includes a CTE (Continuous Time Equalizer) circuit, a peaked current integrator circuit directly connected to an output of the CTE circuit, and a data slicer circuit connected to an output of the peaked current integrator circuit. The peaked current integrator circuit includes a current integrating amplifier circuit comprising an adjustable circuit element to tune a peaking response of the current integrator circuit, and peaking control circuit to generate a control signal to adjust a value of the adjustable circuit element as a function of an operating condition of the data receiver. The operating condition may be a specified data rate of the data receiver or a communication channel characteristic or both. The adjustable circuit element may be a degeneration capacitor or a bias current source.

These and other exemplary embodiments, aspects and features of the present invention will become apparent from the following detailed description of exemplary embodiments thereof, which is to be read in connection with the accompanying drawings.

DETAILED DESCRIPTION OF EXEMPLARY EMBODIMENTS

Exemplary embodiments of the invention will now be discussed in further detail with regard to circuits and methods for implementing analog signal current integrators with tunable peaking functions and, in particular, analog signal current integrators with tunable peaking functions to enable data rate dependant loss compensation for applications in high data rate receiver integrated circuits incorporating advanced equalization functions, such as decision-feedback equalizers.

Figure 1:
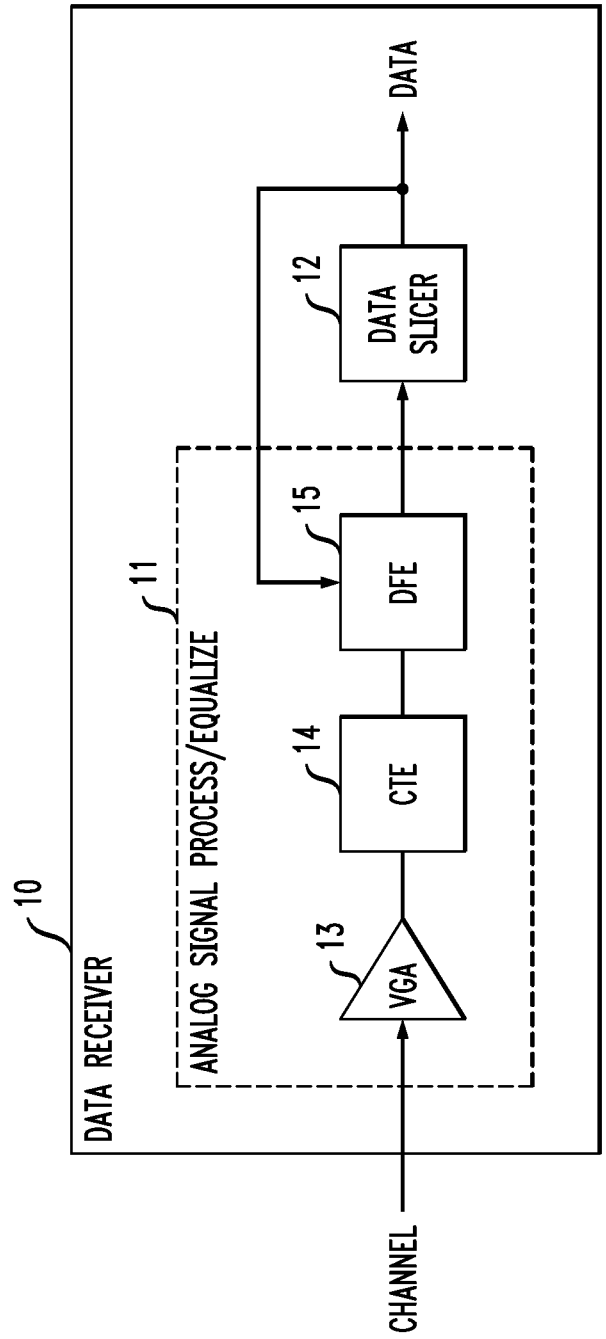
FIG. 1 is a high-level block diagram of a serial data receiver with CTE (Continuous Time Equalizer) and DFE (Decision Feedback Equalizer) processing functions.

FIG. 1 is a high-level block diagram of a serial data receiver. In general, a serial data receiver 10 as depicted in FIG. 1 comprises an analog signal processing and equalizing circuit block 11 and a data slicer 12, which operate to convert an analog signal received over a communications channel to digital values which represent estimates of the transmitted data. The analog signal processing and equalizing circuit block 11 comprises a VGA (variable-gain amplifier) block 13, a CTE (Continuous Time Equalizer) block 14, and a DFE (Decision-Feedback Equalization) block 15, which implement well known functions to process an incoming analog signal and provide line (channel) equalization functions to compensate degradation from line intersymbol interference (ISI). The data slicer block 12 converts the equalized analog signal to binary data using well known techniques.

One problem that arises in the realization of state of the art ultra-high data rate (e.g., 10 to 25 Gb/s) receivers is the need to support a very wide bandwidth in the analog signal processing and equalizing circuit block 11, while simultaneously keeping both the power draw and complexity of the analog circuitry as low as possible. As an example, a serial line receiver designed to operate with a 25 Gb/s incoming data rate typically requires an analog bandwidth of at least 12.5 GHz, or half the data rate, to support non-return-to-zero (NRZ) line signaling. To compensate for line loss, the analog signal processing and equalizing circuit block 11 can implement high frequency peaking through the use of the CTE block 14, to realize a frequency dependent gain which peaks at high frequency. This high frequency peaking extends the bandwidth of the receiver to more than half the data rate.

Although this high-frequency peaking helps equalize the line, it can also increase noise arising from the active and passive components forming the receiver, as the high-frequency peaking simultaneously increases the noise bandwidth of the receiver. High data rate receivers are also susceptible to degradation from broad-band crosstalk noise arising from unwanted parasitic coupling from physically adjacent data channels. Exemplary embodiments of the invention as discussed in detail below provide signal processing frameworks to minimize the impact of both crosstalk noise and receiver circuit noise with high data rate receivers that operate over a wide bandwidth.

Another problem in a practical realization of a data receiver in modern CMOS technology is bandwidth variation of the analog signal processing functions due to process, voltage, and temperature (PVT) variation. To ensure that the data receiver will function at the "worst case" PVT corner, the analog signal processing functions are normally designed to meet a minimum bandwidth requirement to support the desired data rate under the "worst case", low circuit bandwidth conditions. This can result in a very large increase of bandwidth under the "best case" PVT corner, where by definition circuits have more bandwidth. As a result, a problem can arise in that the receiver bandwidth increases so much beyond that which is needed by the data signal itself, that the signal-to-noise ratio (SNR) decreases due to wider noise bandwidth integration on the "best case" PVT corner. Exemplary embodiments of the invention as discussed in detail below provide signal processing frameworks to stabilize receiver noise bandwidth over PVT variation.

Furthermore, a related problem occurs when a serial data receiver is employed in applications that need to operate over a wide data rate range. For instance, a serial data receiver may be designed with a bandwidth that supports the highest data rate (e.g., 25 Gb/s), but the receiver must also operate with "legacy" data rates (e.g, 3 Gb/s). The high bandwidth of the high data rate receiver when used at lower data rates results in non-optimum SNR at the lower data rate. Exemplary embodiments of the invention as discussed in detail below provide signal processing frameworks to control receiver bandwidth as a function of data rate.

Another consideration which is important in the design of the analog signal processing and equalizing circuit block 11 is complexity, as measured in both silicon die area and power draw, which can be substantial with implementation of the VGA, CTE and DFE blocks in the data receiver. Because many data receivers (e.g., 100 or more) may be integrated onto a single integrated circuit, it is necessary to keep both power and area of the data receiver design low. Exemplary embodiments of the invention as discussed in detail below provide signal processing frameworks to realize VGA/CTE/DFE analog signal processing functions with low power and area, while simultaneously meeting bandwidth and noise requirements needed to support high performance operation.

Figure 2:
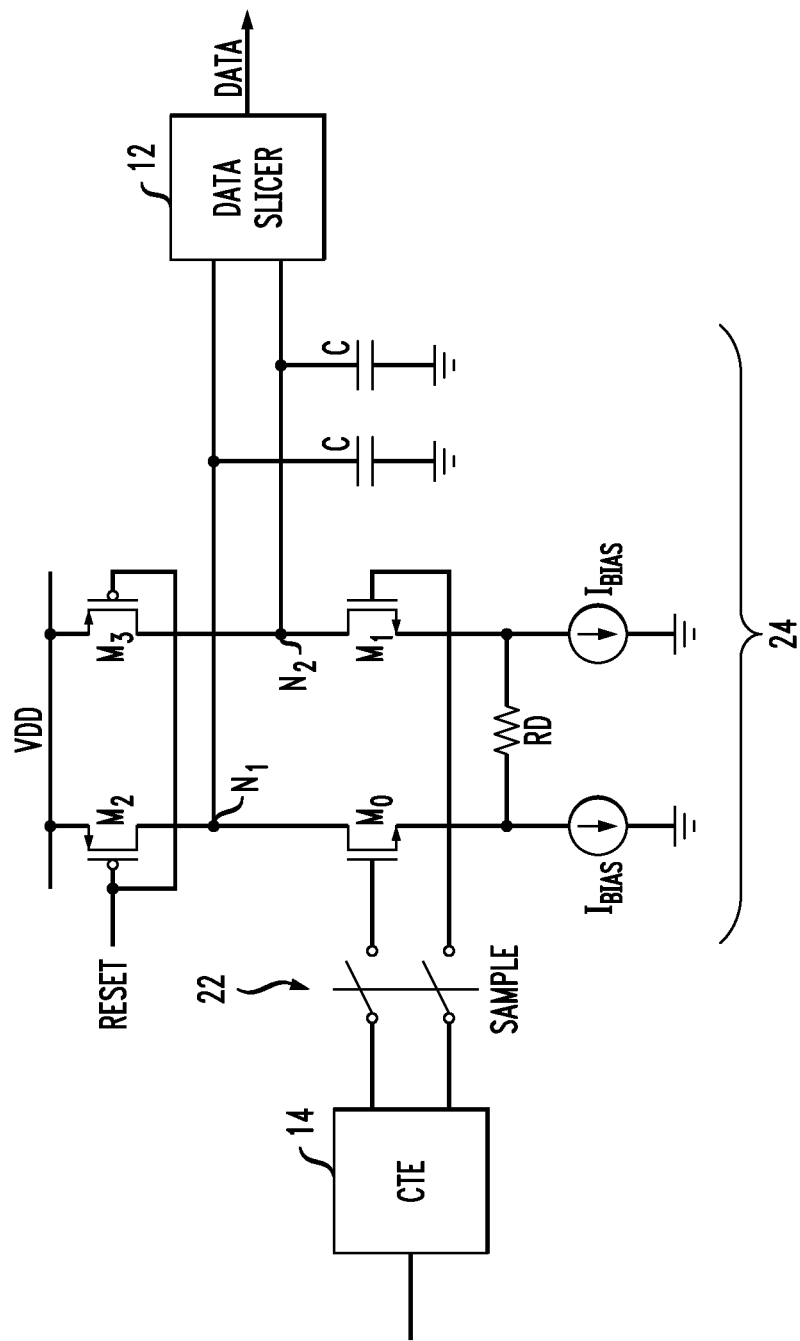
FIG. 2 is a schematic circuit diagram of a sampled current integrator circuit.

In state of the art data receivers, efficient power and area can be realized in analog signal processing functions which implement a DFE by employing a "sampled current integrator" circuit architecture, such as shown in FIG. 2. FIG. 2 is a schematic circuit diagram of a sampled current integrator circuit 20 comprising a CTE block 14, a sampling block 22 (sampling switches), a current integrator circuit 24 and a data slicer block 12. The current integrator circuit 24 has a differential amplifier topology comprising a differential input stage formed by differential transistor pair M0 and M1, and load elements including PMOS switches M2 and M3 that are driven by a clock signal RESET, and resettable capacitors C at each output node N1 and N2. The capacitors C are connected between the output nodes N1 and N2 and ground. The gates of transistors M0 and M1 are differential inputs that receive as input a differential input signal (voltage) from the sampling block 22. The differential amplifier further comprises a degeneration resistor RD and two tail current sources $I_{BIAS}$ to generate a bias current for DC biasing the differential input amplifier.

In this architecture, a signal typically coming from the CTE block 14 in a data receiver front-end is first sampled by the sampling block 22, which samples the incoming signal and holds its state in response to a SAMPLE signal. The sampled value at the input of the current integrator circuit 24 is integrated over a nominal data bit period T (or integration period) by releasing reset on the integrating load capacitors C with the RESET signal. More specifically, when the clock signal RESET is logic "low," the current integrator circuit 24 is in reset mode, and the PMOS transistors M2 and M3 pull up the output nodes N1 and N to the positive power supply voltage VDD. When the clock signal RESET transitions to logic "high," the PMOS transistors M2 and M3 are turned off, the reset period ends, and the drain currents from the input differential pair (which is driven by inputs from the sampling block 22) begin to charge the load capacitors C. During this "integration" period, current is integrated by the capacitors C. With a nonzero differential input voltage, the drain currents from the input differential pair are unequal, so the load capacitors C charge at different rates. At the end of the data bit (integration) period, a positive or negative differential output voltage is developed, and the integrated output from the sampled current integrator block 22/24 is converted to data by the data slicer block 12, which may be realized as a high sensitivity binary latch.

An advantage of the sampled current integrator circuit topology of FIG. 2 is its ability to easily add decision-feedback equalization through the use of additional switched current sources on the capacitive integrating node. The circuit topology also minimizes power and area—since the integrating capacitance C can be very small, it takes very small currents to develop sufficient differential output voltage to reliably drive the data slicer block 12. Further, because the circuit integrates a held value, there is no bandwidth loss in the stage from the integration process itself.

There are some disadvantages to the sampled current integrating approach of FIG. 2. Although the sampled current integrator avoids integrator loss, there is still a loss in bandwidth arising from the sampling process due to the series resistance of samplers within the sampling block 22 combined with the load capacitance at the input of the current integrator. This loss increases at extremely high data rates due to practical limits on how small the series resistance of the samplers 22 and input capacitance of the integrating buffer can be made. Further, the sampling process inherently adds undesired kT/C noise of the sampler to the signal, degrading the SNR of the received signal. The sampling process can also result in significant "kickback" to the stage driving the sampler input due to charge-redistribution from the "hold" capacitance at the output of the sampling block 22 back to its input when the sampling block 22 is re-configured from its "hold" state to its "track" state. This "kickback" effect can result in the need for extra buffer circuitry preceding the sampling block 22 to reduce the "kickback" noise levels to other circuits (such as edge path samplers for use in clock recovery) which may be connected to the output of the CTE block 14. The sampler kickback noise can also degrade high data rate receiver sensitivity if the noise does decay to a sufficiently small level before the sampling block 22 is reconfigured from its "track" state to its "hold" state.

Figure 3:
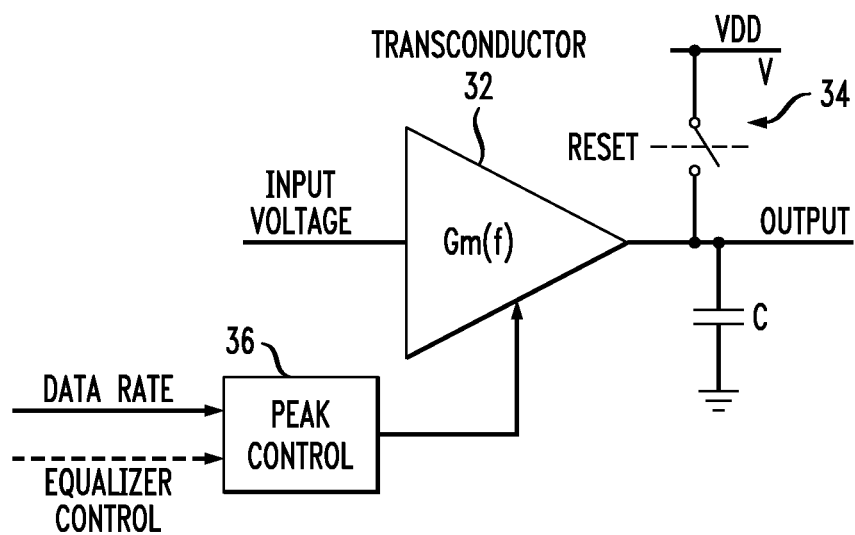
FIG. 3 is a high-level schematic diagram of a variable peaked current integrator circuit, according to an exemplary embodiment of the invention.
Figure 4:
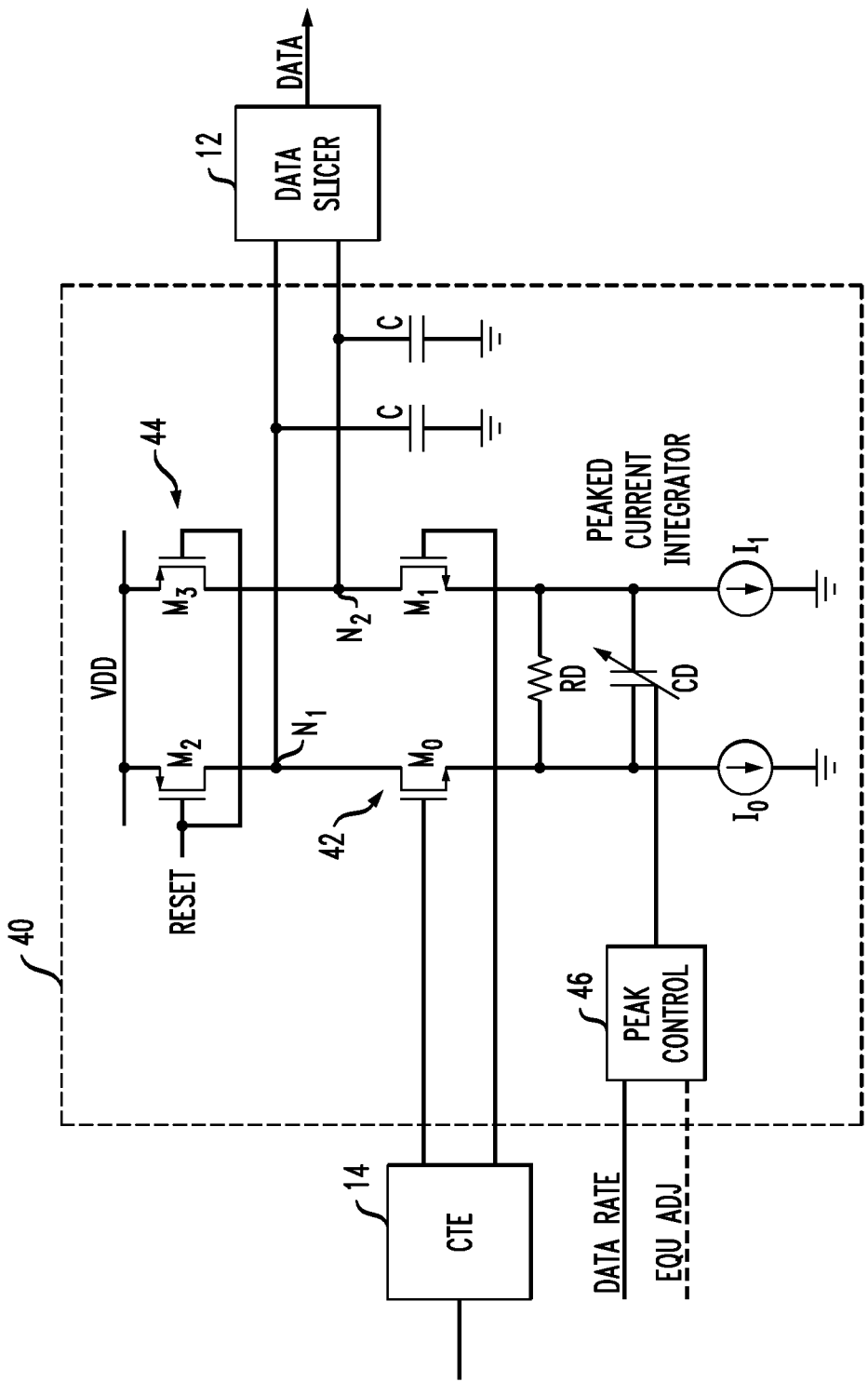
FIG. 4 is a schematic circuit diagram of a variable peaked current integrator circuit using variable capacitive degeneration to control a peaking response of the current integrator circuit, according to an exemplary embodiment of the invention.
Figure 5:
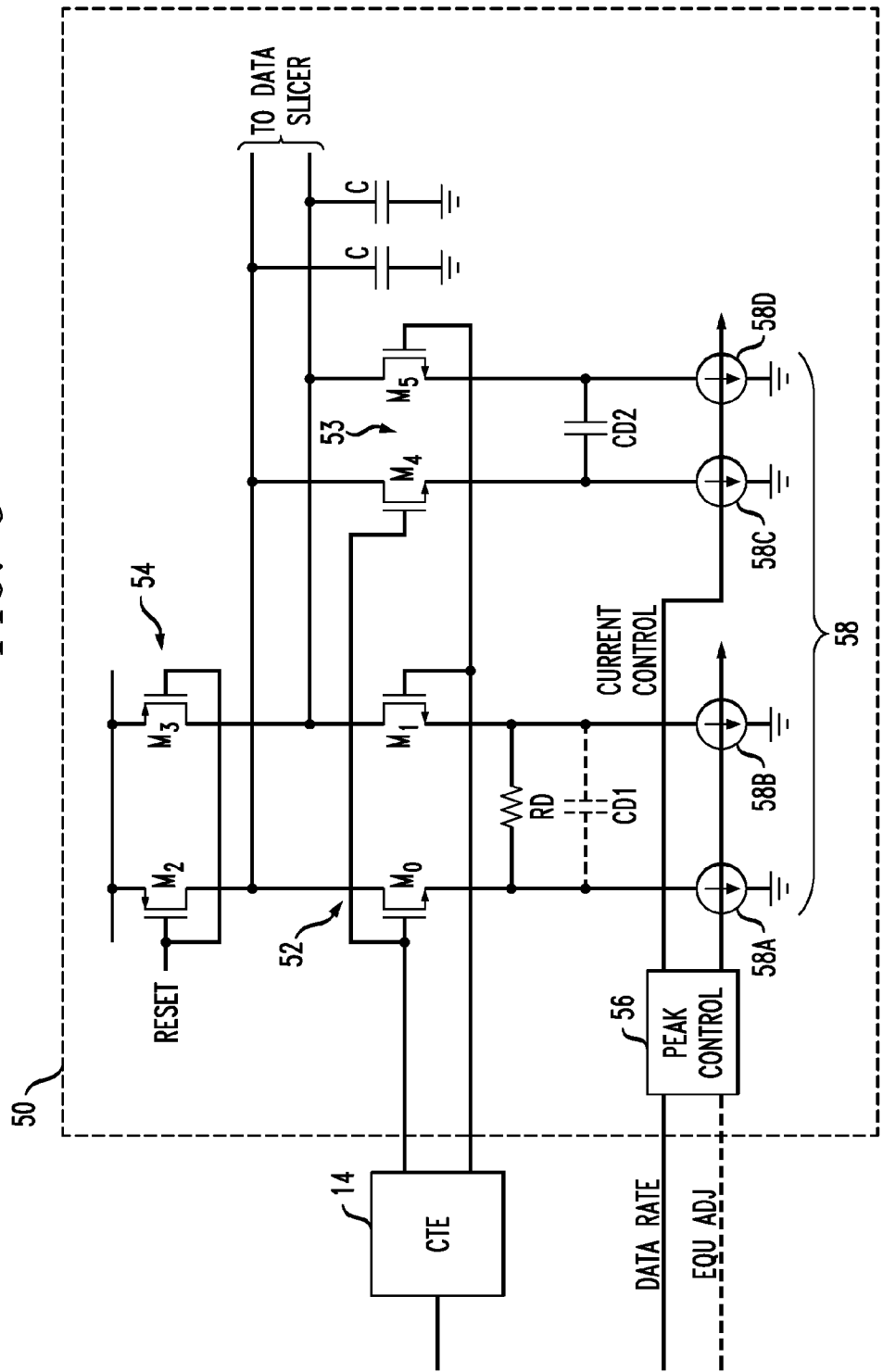
FIG. 5 is a schematic circuit diagram of a variable peaked current integrator circuit using variable bias current control to adjust a peaking response of the current integrator circuit, according to another exemplary embodiment of the invention.

Exemplary embodiments of the invention as shown in FIGS. 3, 4 and 5 provide peaked analog signal current integration topologies that leverage low power and silicon die area as realized by use of a current integrator in the analog signal processing data path, while eliminating bandwidth loss, kT/C noise degradation, and charge-redistribution kickback, which result from the sampling process in the sampled current integrator architecture of FIG. 2. For example, FIG. 3 is a high-level schematic diagram of a variable peaked current integrator circuit, according to an exemplary embodiment of the invention. In general, FIG. 3 depicts a high-level framework of a variable peaked current integrator circuit 30 comprising a transconductance amplifier 32 and a reset circuit 34 (which is controlled by a clock signal RESET), and a capacitor C connected to the output of the transconductance amplifier 32. The transconductance amplifier 32 is designed with a continuous-time adjustable peaking function Gm(f) to vary a peaking response of the current integrator circuit 30 in response to control signals generated by a peaking control module 36.

More specifically, in contrast to the sampled current integrator framework of FIG. 2, the current integrator circuit 30 of FIG. 3 eliminates the sampling circuit at the input of transconductor 32 and implements an input transconductor with a continuous-time adjustable peaking function Gm(f) that is designed to compensate the inherent loss of direct (non-sampled) signal integration. An ideal current integrator will attenuate a time-varying signal level by approximately 4 dB (relative to a DC input) at a frequency equal to 1/(2*T), where T is the integration period which normally corresponds to the bit period in a received NRZ data signal. This is a significant amount of signal loss and, in practice, this loss is greater than the bandwidth loss through the sampler block 22 that is used in the sampled current integrator topology of FIG. 2. The excess loss adds intersymbol interference to the signal and reduces the amount of external line loss that the receiver equalization system can handle. The exemplary framework of FIG. 3 addresses these issues by employing a data-rate dependent variable peaking function, which can be used to not only restore the 4 dB integrator loss, but also adjust the peaking to help compensate other losses in the end-to-end channel.

Since the 4 dB integrator loss always occurs at a frequency equal to 1/(2*T), the peaking function can be adjusted as a function of the integration period T, which in turn is directly related to the operating data rate bit period. More specifically, in the exemplary embodiment of FIG. 3, the peaking control module 36 can receive as input, configuration data indicative of the operating data rate or of a desired equalization control, and/or optionally an additional direct peaking control adjust, to configure a peaking level in the integrating stage of the transconductor 32 to a desired level across a wide data rate range of operation.

In particular, in one embodiment, the peaking control function provides a peaking control to compensate the inherent 4 dB loss of the integrator only, to provide a net "flat" frequency response in the integrator stage independent of operating data rate. In another exemplary embodiment, the peaking control function may be augmented with control from an equalization control process, which further adjusts the peaking control in the integrator stage to achieve improved line equalization.

A peaked current integrator architecture according to principles of the invention inherently provides an effective data detection bandwidth which is closely matched to the data rate of operation, independent of PVT corner. As a result, a peaked current integrator architecture addresses the problem of excess receiver circuit and system crosstalk noise which can occur either on a wide-band PVT corner, or when operating at a low data rate with a broad-band receiver. The detection bandwidth stabilization occurs due to the predictable loss (4 dB) resulting from the integration process at a frequency of 1/(2*T). Compensating this loss through a peaking function of a peaked current integrator architecture according to principles of the invention increases the bandwidth of the integrating stage, but because this compensation is a relatively small amount, the bandwidth variation of the entire receiver over PVT corners is reduced. Also, at frequencies much higher than 1/(2*T), the current integration process results in a high attenuation of noise at the input of the current integrator. As a specific example to illustrate this point, for an input noise frequency of 1/T, a current integrator according to the invention produces a zero output independent of the setting of the peaking function, thereby realizing the goal of eliminating as much noise as possible while maintaining desired signal level equalization.

In one exemplary embodiment of the invention, the peaking function Gm(f) of the transconductor of FIG. 3 is realized by employing a variable degeneration capacitor in a current integrating differential amplifier stage, such as shown in FIG. 4. FIG. 4 is a schematic circuit diagram of a variable peaked current integrator circuit 40 using variable capacitive degeneration to control a peaking response of the current integrator circuit, according to an exemplary embodiment of the invention. The circuit 40 comprises an input amplifier stage 42 formed by differential transistor pair M0 and M1, and further comprising a degeneration resistor RD and a variable degeneration capacitor CD forming a degeneration network, as well as tail current sources I0 and I1 providing DC current for DC biasing the input amplifier stage 42. The gates of the input transistors M0 and M1 are differential inputs that receive as input a differential voltage Vin from a CTE block 14. The drains of transistors M0 and M1 are connected to output nodes N1 and N2. The circuit 40 further comprises a reset circuit 44 comprising PMOS switches M2 and M3 that are driven by a clock signal RESET. The PMOS switches M2 and M3 are connected to resettable capacitors C at each output node N1 and N2. The capacitors C are connected between the output nodes N1 and N2 and ground.

In this architecture, a differential signal output from the CTE block 14 in a data receiver front-end is directly input to the differential inputs of the input amplifier stage 42 (transistors M0/M1). The input signal at the input to the current integrator circuit 40 is integrated over a nominal data bit period T (integration period) by releasing reset on the integrating load capacitors C with the RESET signal. More specifically, when the clock signal RESET is logic "low," the integrator 40 is in reset mode, and the PMOS transistors M2 and M3 pull up the output nodes N1 and N to the positive power supply voltage VDD. When the clock signal RESET goes high, the PMOS transistors M2 and M3 are turned off, the reset period ends, and the drain currents from the input differential pair (which is directly driven by inputs from the CTE circuit 24) begin to charge the load capacitors C. During this "integration" period (or data detection period), current is integrated by the capacitors C. With a nonzero differential input voltage, the drain currents of the input differential pair are unequal, so the capacitors C charge at different rates. At the end of the data detection (integration) period, a positive or negative differential output voltage is developed at the output of the peaked current integrator circuit 40, and the output is converted to data by the data slicer block 12, which may be realized as a high sensitivity binary latch.

The use of the degeneration resistor RD provides a more linear, lower distortion response characteristic, which is desirable for analog applications. The variable degeneration capacitance CD in parallel with the degeneration resistor RD is utilized to introduce a "zero" in the frequency response, so that the high-frequency gain is higher than the DC gain at a desired peaking frequency. At this peaking frequency, the degeneration capacitor CD essentially shorts out the degeneration resistor RD resulting in a higher gain (and lower loss). The amount of peaking (how much the high-frequency gain is boosted relative to the DC gain) can be adjusted by varying the degeneration capacitance CD in the degeneration network in response to control signals output from a peaking control module 46.

In one exemplary embodiment, the variable degeneration capacitor CD can be implemented by employing a plurality of switches to connect different discrete capacitance values in parallel with the shunt degeneration resistor RD using techniques well established in the art. The number of parallel-connected discrete capacitors that are implemented will depend on the amount of unit resolution that is desired for adjusting the value of the degeneration capacitance CD and the desired range of data rates for which the current integrating circuit will be operated.

As noted above, the peaking response of the peaked current integrator circuit 40 of FIG. 4 can be dynamically adjusted as a function of real-time operating conditions such as the operating data rate and/or channel characteristics (adaptive equalization). By way of specific example, to adjust the peaking response for a specified data rate, configuration data can be input to the peaking control module 46 which specifies the data rate of operation, and the peaking control module 46 will generate a control signal to set the value of the degeneration capacitor CD based on the specified data rate. In a further embodiment, during real-time operation of the peaked current integrator circuit, equalization adjustment data (generated, for example, in real-time by some external equalization control processing circuit) can be input to the peaking control module 46 to vary the value of the degeneration capacitor CD (about the initially set degeneration capacitance value selected for the given data rate) to further tune the peaking response of the peaked current integrator circuit 40 to account for channel equalization.

FIG. 5 is a schematic circuit diagram of a variable peaked current integrator circuit using variable bias current control to adjust a peaking response of the current integrator circuit, according to another exemplary embodiment of the invention. In the exemplary embodiment of FIG. 5, the peaking function Gm(f) is realized using a parallel connection of two differential input amplifiers, one with a fixed degeneration resistor (and optional shunt degeneration capacitor) and another with only a shunt degeneration capacitor, wherein high frequency peaking is controlled by varying a tail bias current ratio between the resistor degenerated amplifier and the capacitor-only degenerated amplifier.

More specifically, a variable peaked current integrator circuit 50 as shown in FIG. 5 comprises a first input amplifier stage 52 formed by differential transistor pair M0 and M1, and further comprising a degeneration resistor RD and an optional fixed degeneration capacitor CD1 forming a degeneration network, as well as adjustable tail current sources 58A and 58B providing an adjustable DC current for DC biasing the first input amplifier stage 52. The gates of the input transistors M0 and M1 are differential inputs that receive as input a differential voltage Vin from the CTE block 14. The drains of transistors M0 and M1 are connected to output nodes N1 and N2. The circuit 50 further comprises a reset circuit 54 comprising PMOS switches M2 and M3 that are driven by a clock signal RESET, and resettable capacitors C at each output node N1 and N2. The capacitors C are connected between the output nodes N1 and N2 and ground.

The variable peaked current integrator circuit 50 further comprises a second input amplifier stage 53 formed by differential transistor pair M4 and M5, and further comprising a fixed degeneration capacitor CD2 providing capacitive degeneration for the second input amplifier stage 53, as, well as adjustable tail current sources 58C and 58D providing an adjustable DC current for DC biasing the second input amplifier stage 53. The gates of the input transistors M4 and M5 are differential inputs that are commonly connected to the gates of input transistors M0 and M1, respectively, and receive the same differential voltage Vin from the CTE block 14. The drains of transistors M4 and M5 of the second input amplifier stage 53 are also connected to the output nodes N1 and N2, respectively.

In the exemplary embodiment of FIG. 5, the amount of peaking can be adjusted by varying the amount of bias currents generated by the tail current sources 58 in response to control signals output from a peaking control module 56. By way of example, a high frequency peaking response can be controlled by varying a ratio between the tail bias currents of the adjustable current sources 58A/58B of the first (resistor degenerated) input amplifier stage 52 and the tail bias currents of the adjustable current sources 58C/58D of the second (capacitor-only degenerated) input amplifier stage 53. By way of specific example, to increase the high frequency peaking response of the circuit 50, more bias current can be added to the capacitor-only degenerated input amplifier stage 53, while to decrease the high frequency peaking, this current is reduced toward zero. In one exemplary embodiment of the invention, the adjustable tail current sources can be implemented using common current DACs that are constructed using techniques well known in the art.

Further aspects of the present invention provide peaked current integrating amplifiers which can be utilized in integrated circuit chips with various analog and digital integrated circuitries. In particular, integrated circuit dies can be fabricated having peaked current integrating amplifiers and other semiconductor devices such as field-effect transistors, bipolar transistors, metal-oxide-semiconductor transistors, diodes, resistors, capacitors, inductors, etc., forming analog and/or digital circuits. The peaked current integrating amplifiers can be formed upon or within a semiconductor substrate, the die also comprising the substrate. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A current integrator circuit, comprising:
   a current integrating amplifier circuit comprising an adjustable circuit element to tune a peaking response of the current integrator circuit, wherein the current integrating amplifier circuit is configured to integrate a current on an output capacitance during an integration period of operation of the current integrating amplifier circuit; and
   a peaking control circuit to generate a control signal to adjust a value of the adjustable circuit element as a function of an operating condition of the current integrator circuit.

2. The current integrator circuit of claim 1, wherein the operating condition is a specified data rate.

3. The current integrator circuit of claim 1, wherein the operating condition comprises a communication channel characteristic.

4. The current integrator circuit of claim 1, wherein the adjustable circuit element is a degeneration capacitor.

5. The current integrator circuit of claim 1, wherein the adjustable circuit element is a variable bias current source.

6. The current integrator circuit of claim 1, wherein the current integrating amplifier circuit comprises:
   a current integrating differential amplifier stage comprising a differential transistor pair;
   a degeneration network comprising a degeneration resistor and a variable degeneration capacitor; and
   first and second tail current sources providing DC current for DC biasing the differential transistor pair of the current integrating differential amplifier stage,
   wherein the adjustable circuit element is the variable degeneration capacitor.

7. The current integrator circuit of claim 1, wherein the current integrating amplifier circuit comprises:
   a first current integrating differential amplifier stage comprising:
      a first differential transistor pair M0 and M1;
      a first degeneration network comprising a degeneration resistor; and
      a first set of tail current sources providing DC current for DC biasing the first current integrating differential amplifier stage; and
   a second current integrating differential amplifier stage comprising:
      a second differential transistor pair M2 and M3;
      a second degeneration network comprising a degeneration capacitor; and
      a second set of tail current sources providing DC current for DC biasing the second current integrating differential amplifier stage,
   wherein the adjustable circuit element includes the first and second set of tail current sources.

8. A data receiver comprising the current integrator circuit of claim 1.

9. A data receiver, comprising:
   a CTE (Continuous Time Equalizer) circuit;
   a peaked current integrator circuit directly connected to an output of the CTE circuit; and
   a data slicer circuit connected to an output of the peaked current integrator circuit;
   wherein the peaked current integrator circuit comprises:
      a current integrating amplifier circuit comprising an adjustable circuit element to tune a peaking response of the current integrator circuit, wherein the current integrating amplifier circuit is configured to integrate a current on an output capacitance during an integration period of operation of the current integrating amplifier circuit; and
      a peaking control circuit to generate a control signal to adjust a value of the adjustable circuit element as a function of an operating condition of the data receiver.

10. The data receiver of claim 9, wherein the operating condition is a specified data rate of the data receiver.

11. The data receiver of claim 9, wherein the operating condition comprises a characteristic of an input channel of the data receiver.

12. The data receiver of claim 9, wherein the adjustable circuit element is a degeneration capacitor.

13. The data receiver of claim 9, wherein the adjustable circuit element is a variable bias current source.

14. An integrated circuit (IC) chip comprising an integrated circuit, the integrated circuit comprising a current integrator circuit, the current integrator circuit comprising:
   a current integrating amplifier circuit comprising an adjustable circuit element to tune a peaking response of the current integrator circuit, wherein the current integrating amplifier circuit is configured to integrate a current on an output capacitance during an integration period of operation of the current integrating amplifier circuit; and
   a peaking control circuit to generate a control signal to adjust a value of the adjustable circuit element as a function of an operating condition of the current integrator circuit.

15. The IC chip of claim 14, wherein the operating condition is a specified data rate.

16. The IC chip of claim 14, wherein the operating condition comprises a communication channel characteristic.

17. The IC chip of claim 14, wherein the adjustable circuit element is a degeneration capacitor.

18. The IC chip of claim 14, wherein the adjustable circuit element is a variable bias current source.

19. The IC chip of claim 14, wherein the integrated circuit comprises an integrated data receiver circuit.

20. The IC chip of claim 19, wherein the integrated data receiver circuit comprises a CTE (Continuous Time Equalizer) circuit having an output directly connected to an input of the peaked current integrator circuit, and a data slicer circuit connected to an output of the peaked current integrator circuit.

* * * * *